US006828648B2

(12) United States Patent
Koido et al.

(10) Patent No.: US 6,828,648 B2
(45) Date of Patent: Dec. 7, 2004

(54) SEMICONDUCTOR DEVICE AND METHOD OF MANUFACTURING THE SAME

(75) Inventors: Naoki Koido, Yokohama (JP); Riichiro Shirota, Fujisawa (JP); Hirohisa Iizuka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/655,122

(22) Filed: Sep. 4, 2003

(65) Prior Publication Data

US 2004/0041231 A1 Mar. 4, 2004

Related U.S. Application Data

(62) Division of application No. 09/888,666, filed on Jun. 15, 2001, now Pat. No. 6,639,296, which is a division of application No. 09/437,986, filed on Nov. 10, 1999, now Pat. No. 6,274,434.

(30) Foreign Application Priority Data

Nov. 11, 1998 (JP) ........................................... 10-320595

(51) Int. Cl.$^7$ .............................................. H01L 29/00
(52) U.S. Cl. ........................ 257/510; 257/315; 257/506; 257/501
(58) Field of Search ................................ 257/510, 315, 257/506, 501, 446, 499, 221, 296, 353, 207, 218, 219, 294, 427

(56) References Cited

U.S. PATENT DOCUMENTS

| | | | |
|---|---|---|---|
| 5,148,247 A | 9/1992 | Miura et al. | 357/23.6 |
| 5,753,525 A | 5/1998 | Hsu et al. | 438/261 |
| 6,071,779 A | 6/2000 | Mehrad et al. | 438/262 |
| 6,222,225 B1 | 4/2001 | Nakamura et al. | 257/315 |
| 6,274,434 B1 * | 8/2001 | Koido et al. | 257/E21.682 |
| 6,639,296 B2 * | 10/2003 | Koido et al. | 257/510 |

* cited by examiner

*Primary Examiner*—Richard Booth
*Assistant Examiner*—Walter L. Lindsay, Jr.
(74) *Attorney, Agent, or Firm*—Hogan & Hartson, LLP

(57) ABSTRACT

In a method of manufacturing a semiconductor device of STI structure, a semiconductor structure in which an insulating material layer is formed on a conductive layer which becomes a gate electrode, is prepared. Etching is conducted to the semiconductor structure to form a trench extending from the insulating material layer into the semiconductor substrate in accordance with a pattern of a resist film (not shown) covering an element region. Then, the insulating material layer is backed off by wet etching or the like and the gate electrode is processed while using the insulating material layer as a mask. As a result, it is possible to make the gate electrode smaller in size than the element region and to form a trench upper portion to be wider than the trench lower portion in the depth direction of the trench, thereby providing a good shape of the insulator embedded in the trench by depositing the insulator.

44 Claims, 7 Drawing Sheets

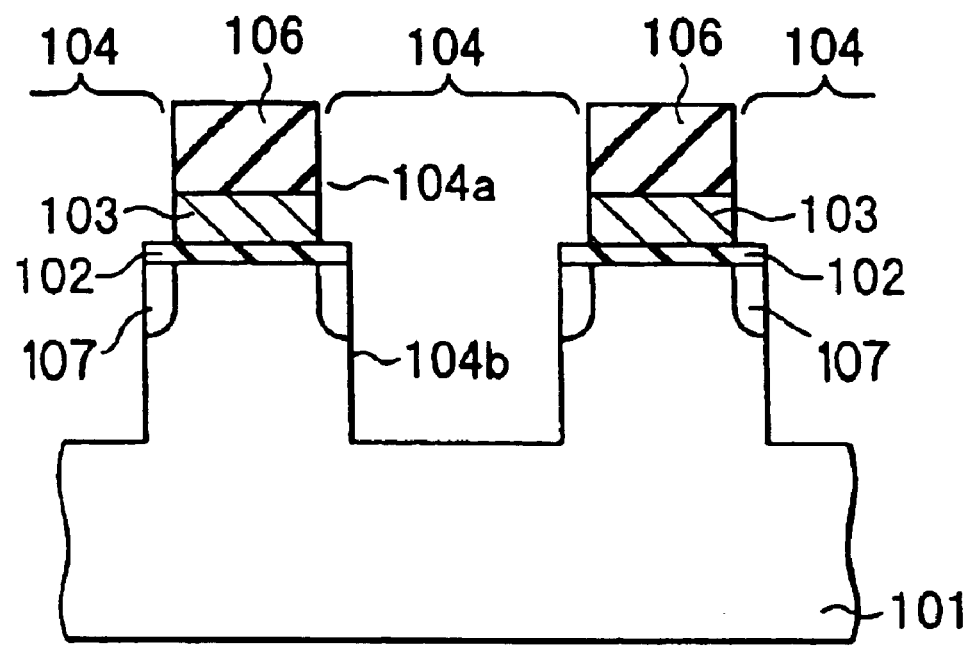
F I G. 15

SEMICONDUCTOR DEVICE AND METHOD OF MANUFACTURING THE SAME

This is a divisional of application Ser. No. 09/437,986 filed Nov. 10, 1999 which is now a U.S. Pat. No. 6,274,434, which is a divisional of Ser. No. 09/888,666 filed Jun. 15, 2001 now U.S. Pat. No. 6,639,296, which application is hereby incorporated by reference in its entirety.

BACKGROUND OF THE INVENTION

The present invention relates to a semiconductor device and a method of manufacturing the same, and particularly relates to a memory cell and a method of manufacturing the same employing an element isolation method for embedding an insulating film into a shallow trench formed in a semiconductor substrate, i.e., employing so-called STI (Shallow Trench Isolation) method.

As a conventional technique, an element isolation method employing STI for using the memory cells on a semiconductor memory device will be described with reference to FIGS. 14A to 14E.

First, as shown in FIG. 14A, the surface of a silicon substrate 901 of, for example, a P-type is oxidized (oxide film 911). At this stage, implantation for forming wells and channels (formation of a channel region) are conducted.

Next, the oxide film 911 is removed and a gate oxide film 904 is formed. At this time, gate oxide films (including those having different thicknesses) for peripheral circuits, not shown, are also formed. Then, a polysilicon 905, which becomes a floating gate electrode, and a stopper material such as a silicon nitride film 912 are deposited, a resist which is not shown is coated thereon and patterning is conducted. Thereafter, as shown in FIG. 14B, using a resist pattern which is not shown as a mask, the silicon nitride film 912, the polysilicon 905 and the gate oxide film 904 are sequentially subjected to anisotropic etching in this order and then the exposed silicon substrate 901 is anisotropically etched. As a result, a trench 902 is formed in the substrate. The resist pattern which is not shown is then removed off.

Next, as shown in FIG. 14C, the inner wall surface of the trench 902 is oxidized so as to ease etching damage (oxide film 913).

A silicon oxide film 903 of, for example, TEOS (tetraethoxysilane) is deposited on the substrate so as to embed the trench 902. As shown in FIG. 14D, using a chemical mechanical polishing technique or so-called CMP, the surface of the silicon oxide film 903 is flattened. The oxide film 903 is polished off until the surface of the silicon nitride film 912 is exposed.

Finally, as shown in FIG. 14E, the silicon nitride film 912 serving as a stopper material is removed, thereby completing element isolation. Thereafter, if a nonvolatile semiconductor memory is to be formed, an ONO film (a layered film of oxide film/nitride film/oxide film), a polysilicon layer which becomes a control gate electrode are deposited and patterned into the form of a gate, whereby a memory cell is formed.

As stated above, with the element isolation method in which after the gate oxide film 904 and the gate member 905 are sequentially formed, the gate member 905, the gate oxide film 904 and the silicon substrate 901 are sequentially etched and in which an STI structure is formed in a self-aligned manner to the gate member 905, the insulating film embedded in the element isolation region is less likely to be polished off in a later step and good element isolation characteristics can be obtained. This is because, if the element isolation region of STI structure is formed on the silicon substrate and then the gate member is deposited on the silicon substrate through the gate oxide film and patterned, it is necessary at the time of forming the STI structure to remove a covering oxide film having been formed over the semiconductor substrate and to form a new gate oxide film. In that case, the insulating film embedded in the element isolation region is inevitably backed off. The above-stated element isolation method, by contrast, does not include such a covering oxide film removing step (see, for example, Jpn. Pat Appln. KOKAI Publication No. 8-17948).

Meanwhile, it is now assumed that the depth of the trench 902 including the thickness of the CMP stopper material (silicon nitride film 912) is D1 and the width of the element isolation region of STI structure is W1. If fine processing progresses, the ratio of D1 to W1, i.e. D1/W1, increases. As a result, the shape of the insulating film (oxide film 903) embedded as STI structure in the trench by the deposition, becomes worse. For example, due to the processing irregularity for trench widths, the phenomenon that a clearance is formed in the vicinity of the center of the embedded trench occurs. To avoid this, after depositing the oxide film 903, a high-temperature, long-time thermal step is conducted. Through this step, the trench is formed to be filled up by an insulator without clearances.

As stated above, with the STI structure, if the trench is formed to be filled with the insulator without clearances, a high-temperature, long-time thermal step must be conducted after the deposition of the insulating film (oxide film 903). According to the manufacturing method for forming the gate oxide film 904 and the like (including gate insulating films for peripheral circuits having different thicknesses) prior to the element region formation step (element isolation step), however, if such a high-temperature, long-time thermal step is conducted, then the gate oxide film deteriorates, diffused layer profile control becomes difficult to make. In this way, reliability of the conventional method is disadvantageously low.

Furthermore, even after a thermal step which is conducted so as not to cause the above-stated reliability-related disadvantages, a depression tends to remain in the upper end portion of the trench. If this depression remains, etching residue is highly likely to remain in the depression when a polysilicon layer or the like which becomes a control gate electrode is deposited and patterned into the form of gate in a later step. If this etching residue remains along the depression, short-circuit may possibly occurs between gates at worst.

BRIEF SUMMARY OF THE INVENTION

The present invention has been achieved in view of the above-stated circumstances. It is, therefore, an object of the present invention to form a trench of STI structure which can make elements smaller in size and realize high integration, into a shape facilitating embedding an insulator into the trench by deposition without generating any clearance, and to thereby provide a highly integrated, highly reliable semiconductor device and a method of manufacturing the same.

A method of manufacturing a semiconductor device according to a first aspect of the present invention, comprises a step of forming a photoresist pattern to cover a predetermined element region on an insulating material layer which is formed on a first gate electrode material layer, the first gate electrode material layer being formed on a first gate insulating film which is formed on a semiconductor substrate; a step of etching the insulating material layer, the first gate electrode material layer, the first gate insulating film and the semiconductor substrate in accordance with the photoresist pattern to form a trench; a step of partially etching the insulating material layer so as to make the insulating material layer smaller in size than at least the element region; and a step of etching the first gate electrode material layer while using the insulating material layer as a mask.

The method of manufacturing a semiconductor device, according to the first aspect of the present invention, may further comprise a step of depositing an insulator over the surface of the semiconductor substrate to embed the insulator in the trench; a step of flattening the insulator deposited over the surface of the semiconductor substrate until a surface of the insulating material layer is exposed; a step of removing the insulating material layer; and a step of patterning the first gate electrode material layer. The method of manufacturing a semiconductor device, may further comprise a step, performed after the step of removing the insulating material layer, of forming a second gate insulating film over the surface of the semiconductor substrate to cover the first gate electrode material layer and the insulator; a step of forming a second gate electrode material layer on the second gate insulating film; and a step of patterning the second gate electrode material layer and the second gate insulating film, and wherein in the step of patterning the first gate electrode material layer, the first gate electrode material layer may be patterned in a self-aligned manner to the second gate electrode material layer and the second gate insulating film.

The method of manufacturing a semiconductor device according to the first aspect of the present invention, may further comprise a step, performed after the step of etching the first gate electrode material layer while using the insulating material layer as a mask, of implanting an impurity into that portion of the semiconductor substrate on which the first gate electrode material layer is not provided, using the insulating material layer partially etched as a mask. In the method of manufacturing a semiconductor device, a conductivity of the impurity may be the same as that of the semiconductor substrate.

The method of manufacturing a semiconductor device according to the first aspect of the present invention, may further comprise a step, performed after the step of etching the first gate electrode material layer while using the insulating material layer as a mask, of removing the insulating material layer; and a step of implanting an impurity into that portion of the semiconductor substrate on which the first gate electrode material layer is not provided, using the first gate electrode material layer as a mask. In the method of manufacturing a semiconductor device, a conductivity of the impurity may be the same as that of the semiconductor substrate.

A method of manufacturing a semiconductor device according to a second aspect of the present invention, comprises a step of forming a first gate insulating film on a semiconductor substrate; a step of depositing a first gate electrode material layer on the first gate insulating film; a step of depositing an insulating material layer on the first gate electrode material layer; a step of forming a photoresist pattern on the insulating material layer to cover a predetermined element region; a step of etching the insulating material layer, the first gate electrode material layer, the first gate insulating film and the semiconductor substrate in accordance with the photoresist pattern to form a trench; a step of partially etching the insulating material layer so as to make the insulating material layer smaller in size than the element region; and a step of etching the first gate electrode material layer while using the insulating material layer as a mask.

The method of manufacturing a semiconductor device according to the second aspect of the present invention, may further comprise a step of depositing an insulator over the surface of the semiconductor substrate to embed the insulator in the trench; a step of flattening the insulator deposited over the surface of the semiconductor substrate until a surface of the insulating material layer is exposed; a step of removing the insulating material layer; and a step of patterning the first gate electrode material layer. The method of manufacturing a semiconductor device, may further comprise a step, performed after the step of removing the insulating material layer, of forming a second gate insulating film over the surface of the semiconductor substrate to cover the first gate electrode material layer and the insulator; a step of forming a second gate electrode material layer on the second gate insulating film; and a step of patterning the second gate electrode material layer and the second gate insulating film, and wherein in the step of patterning the first gate electrode material layer, the first gate electrode material layer may be patterned in a self-aligned manner to the second gate electrode material layer and the second gate insulating film.

The method of manufacturing a semiconductor device according to the second aspect of the present invention, may further comprise a step, performed after the step of etching the first gate electrode material layer while using the insulating material layer as a mask, of implanting an impurity into that portion of the semiconductor substrate on which the first gate electrode material layer is not provided, using the insulating material layer partially etched as a mask. In the method of manufacturing a semiconductor device, a conductivity of the impurity may be the same as that of the semiconductor substrate.

The method of manufacturing a semiconductor device according to the second aspect of the present invention, may further comprise a step, performed after the step of etching the first gate electrode material layer while using the insulating material layer as a mask, of removing the insulating material layer; and a step of implanting an impurity into that portion of the semiconductor substrate on which the first gate electrode material layer is not provided, using the first gate electrode material layer as a mask. In the method of manufacturing a semiconductor device, a conductivity of the impurity may be the same as that of the semiconductor substrate.

A method of manufacturing a semiconductor device according to a third aspect of the present invention, comprises a step of forming a first gate insulating film on a semiconductor substrate; a step of depositing a first gate material layer on the first gate insulating film; a step of depositing an insulating material layer on the first gate material layer; a step of forming a photoresist pattern on the insulating material layer to cover a predetermined element region; a step of etching the insulating material layer, the first gate material layer, the first gate insulating film and the semiconductor substrate in accordance with the photoresist pattern to form a trench; a step of partially etching the insulating material layer so as to make the insulating material layer smaller in size than the element region; and a step of etching the first gate material layer while using the insulating material layer as a mask.

The method of manufacturing a semiconductor device, according to the third aspect of the present invention, may further comprise a step of depositing an insulator over the surface of the semiconductor substrate to embed the insulator in the trench; a step of flattening the insulator deposited over the surface of the semiconductor substrate until a surface of the insulating material layer is exposed; a step of removing the insulating material layer; a step of forming a second gate material layer at a portion on the first gate material layer at which the insulating material layer has been removed to form a first gate electrode material layer; a step of forming a second gate insulating film over the surface of the semiconductor substrate to cover the first gate electrode material layer and the insulator; a step of forming a second gate electrode material layer on the second gate insulating film; and a step of patterning the second gate electrode material layer, the second gate insulating film and the first gate electrode material layer into a line form in a direction substantially orthogonal to the trench, to form an arrangement of an array part of memory cells each having the first gate electrode material layer as a floating gate and the second gate electrode material layer as a control gate. The method of manufacturing a semiconductor device may further comprise a step of etching back the insulator by a predetermined amount, after the step of forming the first gate electrode material layer. In the method of manufacturing a semiconductor device, the first gate material layer may be made of amorphous silicon. In the method of manufacturing a semiconductor device, the second gate material layer may be made of conductive polysilicon. In the method of manufacturing a semiconductor device, the insulating material layer may be made of silicon nitride. In the method of manufacturing a semiconductor device, the insulator may be the silicon dioxide. In the method of manufacturing a semiconductor device, the second gate insulating film may comprise a three-layered film of oxide film/nitride film/oxide film. In the method of manufacturing a semiconductor device, the second gate electrode material layer may be made of polysilicon.

The method of manufacturing a semiconductor device according to the third aspect of the present invention, may further comprise a step, performed after the step of etching the first gate material layer while using the insulating material layer as a mask, of implanting an impurity into that portion of the semiconductor substrate on which the first gate material layer is not provided, using the insulating material layer partially etched as a mask. In the method of manufacturing a semiconductor device, a conductivity of the impurity may be the same as that of the semiconductor substrate.

The method of manufacturing a semiconductor device according to the third aspect of the present invention, may further comprise a step, performed after the step of etching the first gate material layer while using the insulating material layer as a mask, of removing the insulating material layer; and a step of implanting an impurity into that portion of the semiconductor substrate on which the first gate material layer is not provided, using the first gate material layer as a mask. In the method of manufacturing a semiconductor device, a conductivity of the impurity may be the same as that of the semiconductor substrate.

A semiconductor device according to a fourth aspect of the present invention, comprises a semiconductor substrate having an element region; a first gate insulating film formed on the element region of the semiconductor substrate; a first gate electrode layer on the first gate insulating film, the first gate electrode layer being smaller in size than the element region to provide a step portion between the semiconductor substrate and the first gate electrode layer; an element isolation film embedded in a trench formed adjacent to the semiconductor substrate and the first gate electrode layer, the trench having a shape in which an upper portion is wider than a lower portion due to the step portion formed between the semiconductor substrate and the first gate electrode layer.

The semiconductor device according to the fourth aspect of the present invention may further comprise an insulator embedded in the trench. The semiconductor device may further comprise a second gate insulating film formed on the first gate electrode material layer; and a second gate electrode layer on the second gate insulating film; and wherein the first gate electrode layer may be patterned in a self-aligned manner to the second gate electrode layer and the second gate insulating film.

In the semiconductor device according to the fourth aspect of the present invention, the first gate electrode layer may be made of polysilicon.

In the semiconductor device according to the fourth aspect of the present invention, the second gate electrode layer may be made of polysilicon.

In the semiconductor device according to the fourth aspect of the present invention, the insulator may be made of silicon dioxide.

In the semiconductor device according to the fourth aspect of the present invention, the first gate insulating film may be made of silicon dioxide.

In the semiconductor device according to the fourth aspect of the present invention, the second gate insulating film may comprise a three-layered film of oxide film/nitride film/oxide film.

The semiconductor device according to the fourth aspect of the present invention, may further comprise an impurity diffused region formed in that portion of the element region of the semiconductor substrate on which the first gate electrode layer is not provided. In the semiconductor device, a conductivity of the impurity diffused region may be the same as that of the semiconductor substrate.

According to the method of manufacturing a semiconductor device of the present invention, the insulating material layer which defines the element region is further etched to be backed off, and the opening portion of the trench is widened by etching the gate electrode material layer with the size-reduced insulating material layer used as a mask. Thus, in a semiconductor device manufactured by the manufacturing method of the present invention, the shape of insulator embedded in the trench by the deposition of the insulator can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 15 is a cross-sectional view of a semiconductor structure of a modification of the semiconductor structure shown in FIG. 3.

DETAILED DESCRIPTION OF THE INVENTION

Figure 1:
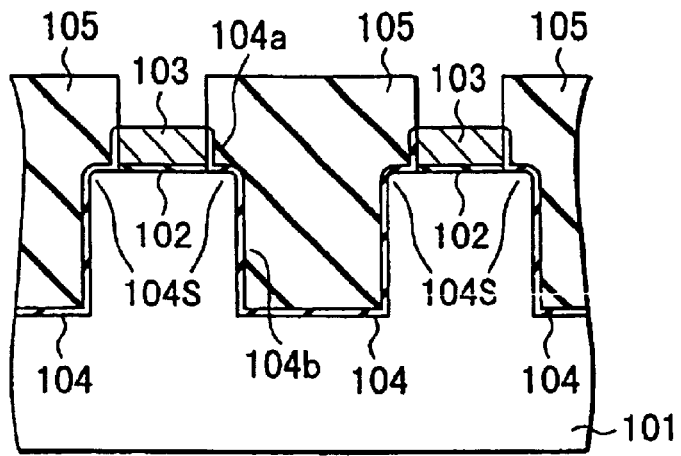
FIG. 1 is a cross-sectional view of a semiconductor structure at the most characteristic manufacturing step of a semiconductor device manufacturing method according to the present invention.

FIG. 1 is a cross-sectional view of a semiconductor structure at the most characteristic manufacturing step of a semiconductor device manufacturing method according to the present invention;

An element isolation region between MOS type elements on a semiconductor substrate has an STI structure with a feature of the present invention. A gate oxide film 102 is formed on a semiconductor substrate 101. A gate electrode 103 is formed on the gate oxide film 102. A portion of the semiconductor substrate below the gate electrode 103 serves as a channel region. Although a source/drain region is formed in the surface region of the substrate on both sides of the gate electrode in a cross section perpendicular to the cross section shown in FIG. 1, it is not shown in FIG. 1.

A trench 104 for element isolation provided between the adjacent gate electrodes 103 has a step portion 104S between an upper portion 104a and a lower portion 104b in depth direction, so that the upper portion 104a is larger in size than the lower portion 104b.

The inner wall of upper portion 104a in the depth direction of the trench 104 and that of the lower portion 104b in the depth direction thereof constitute different portions across the step portion 104S. In this embodiment, the inner wall of the lower portion 104b in the depth direction of the trench 104 is the semiconductor substrate 101 and that of the upper portion 104a in the depth direction is the gate electrode 103.

An insulator 105 is embedded in the trench 104. Since the upper portion 104a in the depth direction of the trench 104 is wider, i.e., the opening portion of the trench 104 is wider, than the lower portion 104b, the insulator 105 tends to be easily deposited in the trench 104 without generating clearances and seams. In other words, the insulator 105 is sufficiently embedded into the trench 104 by the deposition, and thus the shape of the insulator 105 embedded in the trench 104 by the deposition can be improved.

This can also prevent a cavity from being generated within the trench due to fact that the upper portion of the trench is filled up faster than any other portion when the insulator is deposited. If a cavity is generated, atmospheric pressure within the cavity increases and so does stress, with the result that physical destruction may possibly occur in a later thermal step. Thus, the above-stated trench 104 can get rid of this potential fear.

Figure 2:
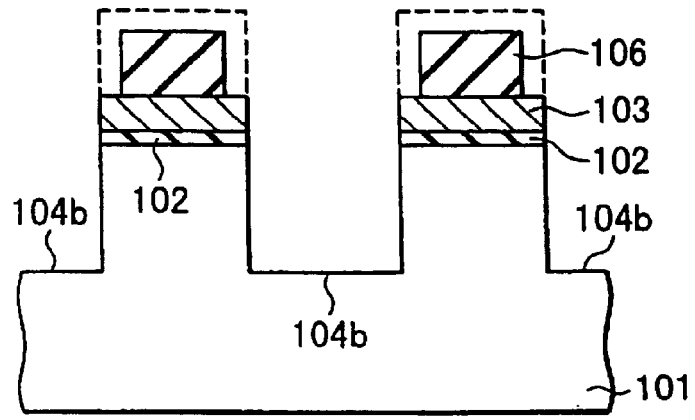
FIG. 2 is a cross-sectional view of a semiconductor structure of the semiconductor device shown in FIG. 1, at a manufacturing step of the semiconductor device manufacturing method according to the present invention.

In the method of forming the trench 104 described above, as shown in, for example, FIG. 2, photolithographic technique is used for the structure in which an insulating material layer 106 is formed on a conductive layer (first gate material layer) which becomes a gate electrode 103. First, etching is conducted to the insulating material layer 106 until the lower portion 104b reaching the substrate 101 in the depth direction of the trench 104 according to the pattern of a resist film (not shown) covering the element isolation region. Then, the insulating material layer 106 is backed off by means of, for example, wet etching, to reduce the size thereof.

Next, the gate electrode 103 is processed again according to the pattern of the size-reduced insulating material layer 106. That is to say, the gate electrode 103 is made smaller in size than the element isolation region. It is, therefore, possible to form the upper portion 104a of the trench 104 in the depth direction to be wider than the trench lower portion 104b (FIG. 3).

Thereafter, the inner wall of the trench 104 is oxidized thinly and then an insulator 105 is deposited by the CVD (chemical vapor deposition) method so as to fill in the trench 104. Using the CMP (chemical mechanical polishing) method in which the insulating material layer 106 is used as a stopper, the insulator 105 is flattened. After flattening, the insulating material layer 106 is removed. As a result, the structure shown in FIG. 1 can be obtained.

Figure 3:
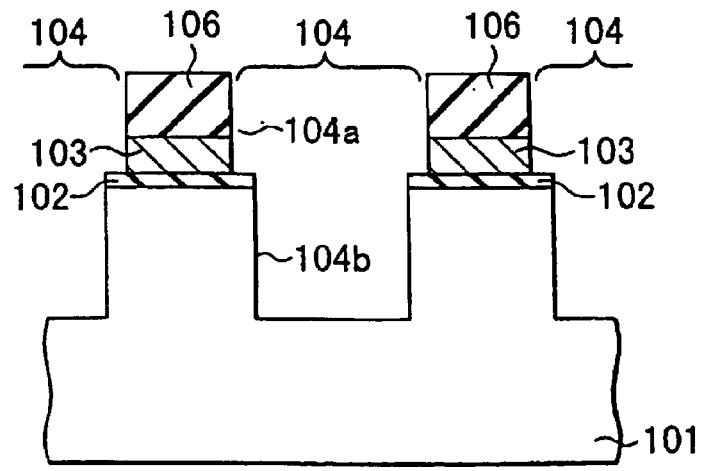
FIG. 3 is a cross-sectional view of a semiconductor structure of the semiconductor device shown in FIG. 1, at a manufacturing step of the semiconductor device manufacturing method according to the present invention.

As shown in FIG. 15, it is preferable to implant impurities and provide impurity diffused regions 107 of a high concentration in those portions of the surface region of the semiconductor substrate or well 101 of the semiconductor device shown in FIG. 3, on which portions the MOS gate i.e. gate electrode 103 is not provided, using the insulating material layer 106 as a mask. The implantation may be performed after the insulating material layer 106 is removed, using the exposed gate electrode 103 as a mask. By providing the impurity diffused regions 107 on those portions of the surface region of the semiconductor substrate 101, a leakage current would be prevented from flowing through said those portions region when the MOS gates are turned off. As a result, the MOS gates are prevented from malfunctioning. When the semiconductor substrate or well 101 is of P conductivity type, a P conductivity type impurity, for example boron, may be used as the impurities implanted into the surface region of the semiconductor substrate to form the impurity diffused regions 107. If on the other hand, the semiconductor substrate or well 101 is of N conductivity type, an N conductivity type impurity, for example phosphorus, may be used as the impurities implanted into the surface region of the semiconductor substrate to form the impurity diffused regions 107.

Further, although not shown, it is also possible to embed conductive material (second gate material layer) in a portion of the trench at which the insulating material layer 106 has been removed so as to decrease resistance. As material for the gate electrode 103, amorphous silicon may be used. Amorphous silicon is excellent in processing accuracy. Accordingly, the accuracy of processing the gate electrode 103 which has a gate width smaller than the dimension of the element region and which is formed in accordance with the insulating material layer 106 can be enhanced.

With the above structure, the shape of the insulator 105 embedded in the trench by the deposition can be improved. This makes it possible to conduct a thermal step for providing the better shape of the insulator 105 embedded in the trench by the deposition, at lower temperature and at shorter time than in the conventional method.

Consequently, the semiconductor device manufacturing method for forming a gate oxide film prior to the element region formation step can advantageously reduce the deterioration of the gate oxide film and facilitate controlling the profiles of diffused layers in, for example, the channel region.

The advantages can be attained by, for example, the formation of a memory cell of an electrically erasable nonvolatile semiconductor memory having a floating gates such as an NAND type EEPROM, AND type EEPROM, DINOR type EEPROM, NOR type EEPROM or the like. Now, description will be typically given to an NAND type EEPROM memory cell.

Figure 4A:
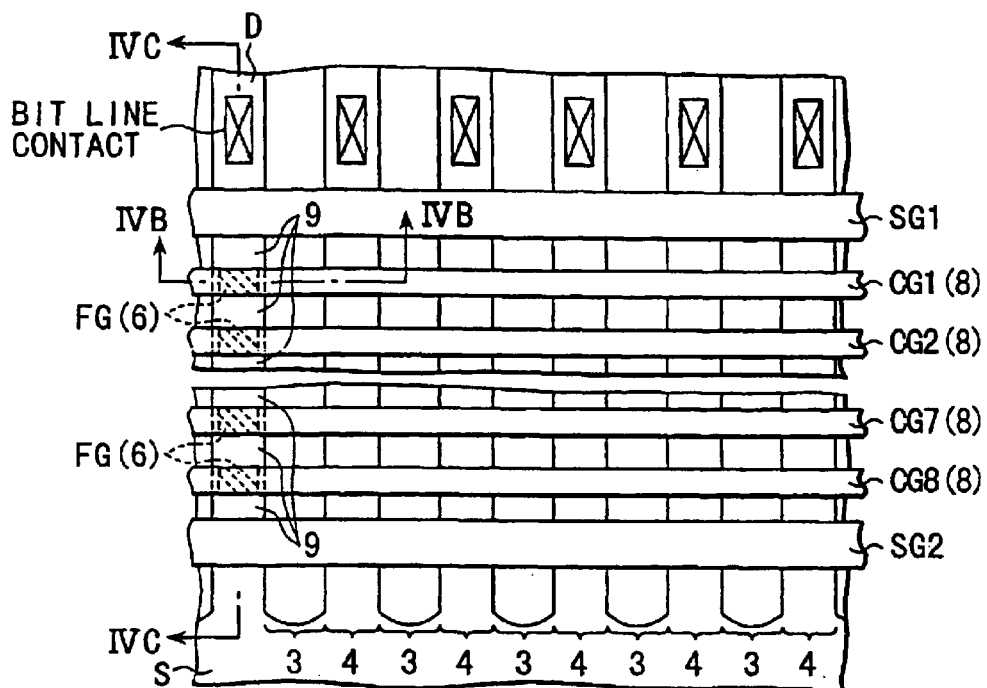
FIG. 4A is a plan pattern view of a NAND type EEPROM memory cell according to a semiconductor device manufacturing method of the present invention.
Figure 4B:
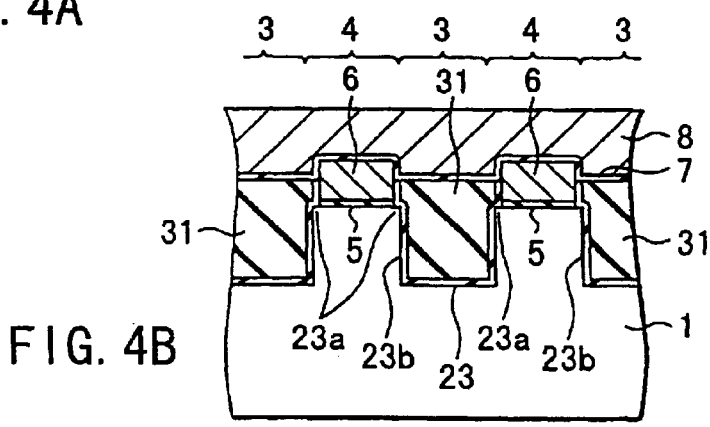
FIG. 4B is a cross-sectional view of the NAND type EEPROM memory cell shown in FIG. 4A, taken along the line IVB—IVB in FIG. 4A.
Figure 4C:
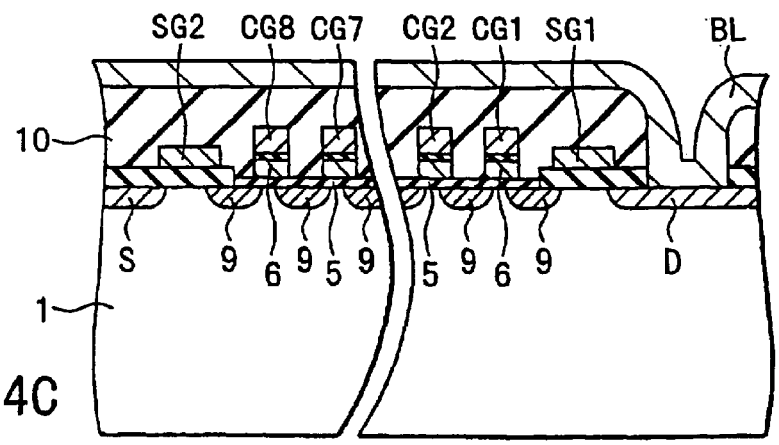
FIG. 4C is a cross-sectional view of the NAND type EEPROM memory cell shown in FIG. 4A, taken along the line IVC—IVC in FIG. 4A.

FIGS. 4A to 4C show an NAND type EEPROM memory cell according to a semiconductor device manufacturing method of the present invention. FIG. 4A is a plan pattern view of a NAND type EEPROM memory cell; FIG. 4B is a cross-sectional view of the NAND type EEPROM memory cell shown in FIG. 4A, taken along the line IVB—IVB in FIG. 4A; FIG. 4C is a cross-sectional view of the NAND type EEPROM memory cell shown in FIG. 4A, taken along the line IVC—IVC in FIG. 4A;

Element isolation regions 3 (to be referred to as STI regions) constituted by the STI technique and element regions 4 are formed on a silicon substrate 1. The STI regions 3 define the element regions 4 of the memory cell in a stripe form to thereby constitute the array part of the memory cell. In the element region 4, a conductive layer 6, which becomes a floating gate electrode FG, is formed on a channel region between source/drain diffused layers 9 through a gate oxide film 5.

The conductive layer (floating gate electrode FG) 6 constitutes the inner wall of the upper portion of a trench 23 in the STI region 3 and has a smaller size than that of the element region 4. Due to this, the upper region 23a in the depth direction of the trench 23 is wider than the lower portion 23b in the depth direction thereof. With this structure, as also shown in FIG. 1, the opening portion of the trench 23 is wider than the lower portion 23b of the trench 23 and an insulator 31 can be, therefore, easily embedded in the trench 23 without generating clearances and seams. Namely, it is possible to improve a shape of the insulator embedded in the trench by depositing the insulator (see FIG. 4B), when compared with the conventional method.

A conductive layer 8 which becomes a control gate electrode CG is formed on the floating gate electrode FG, i.e. the floating gate electrode 6, through an interlayer insulating film 7, CG denoting any one of the floating gate electrodes CG1, CG2, . . . CG7, CG8. The control gate electrode CG, i.e. the control gate electrode 8, is formed in a line form in a direction crossing the stripe-shaped element regions 4 (see FIG. 4B). In this example, eight memory cells of stacked gate structure having floating gates provided corresponding to eight control gate electrodes CG1 to CG8, respectively constitute one memory cell unit. One end of the memory cell unit connected in series to the source/drain regions 9 through channel regions is connected to a drain D which becomes a bit line contact through a selection gate SG1. The other end of the memory cell is connected to a diffused source line S through a selection gate SG2 (see FIG. 4C).

It is noted that FIG. 4C illustrates a bit line BL connected to the bit line contact D through an interlayer insulating film 10 and that FIG. 4A only illustrates the bit line contact D.

As shown in the cross-sectional view of FIG. 4B, the present invention provides a structure capable of improving the shape of the insulator embedded in the trench by deposition of the insulator in the formation of the STI region 3 compared with the conventional method and capable of decreasing the temperature of a thermal step and shortening time. It is thereby possible to reduce the deterioration of the gate insulating film which deterioration causes a deterioration of the memory cell characteristics and to enhance the control characteristics for the profiles of diffused layers in, for example, the channel region.

Next, description will be given to the method of manufacturing a memory cell included in a NAND type EEPROM as shown in FIG. 4B, with reference to FIGS. 5 to 12.

FIGS. 5 to 12 are cross-sectional views of the memory cell included in the NAND type EEPROM employing STI structure for element isolation as shown in FIG. 4B, which are in respective steps of a semiconductor device manufacturing method of the present invention.

First, an oxide film (not shown), for example, is formed on a P-type silicon substrate 1 and the implantation of wells and channels (channel region formation) is conducted. The oxide film is then removed.

Figure 5:
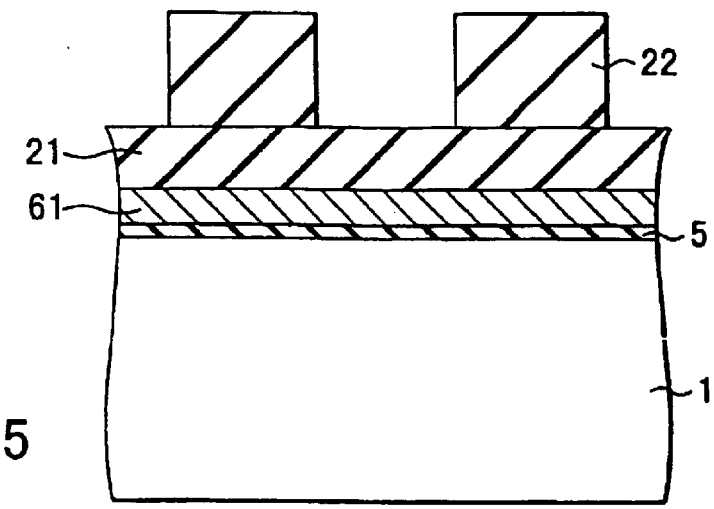
FIG. 5 is a cross-sectional view of memory cell included in the NAND type EEPROM employing STI structure for element isolation as shown in FIG. 4B, which is in a step of a semiconductor device manufacturing method of the present invention.

As shown in FIG. 5, a gate oxide film 5 is formed on the semiconductor substrate 1. Gate oxide films (including those having different thicknesses) for peripheral circuits are formed as well. An amorphous silicon (first gate material layer) 61 which becomes a floating gate material and an insulating material layer such as a silicon nitride film 21 are deposited by the CVD method. Thereafter, a photoresist 22 is coated and patterning is conducted to form a photoresist pattern covering an element region.

Figure 6:
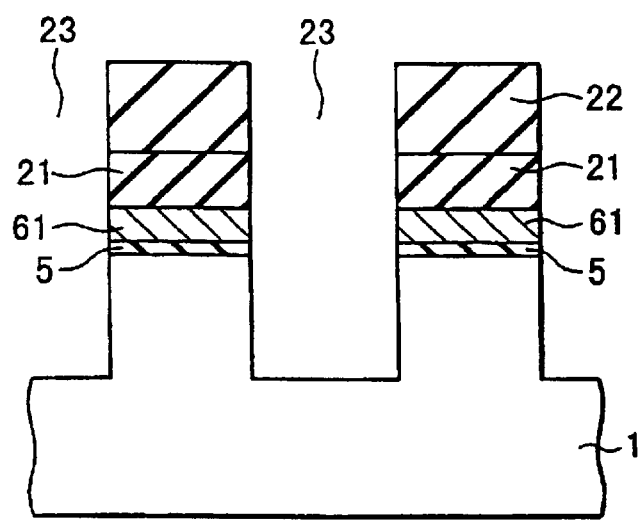
FIG. 6 is a cross-sectional view of the memory cell included in the NAND type EEPROM as shown in FIG. 4B, which is in a succeeding step of the step of FIG. 5 of the semiconductor device manufacturing method of the present invention.

Then, as shown in FIG. 6, using the pattern of the photoresist 22 as a mask, the silicon oxide film 21, the amorphous silicon 61 and the gate oxide film 5 are sequentially anisotropically etched by means of an RIE (Reactive Ion Etching) method, and the silicon semiconductor substrate 1 exposed as a result of the former etching is also anisotropically etched by the RIE method. Thus, a trench 23 is formed in the substrate 1. The width of the trench 23 is about 0.3 µm. The depth of the trench 23 excluding that of the photoresist 22 is about 0.55 µm and the depth from the surface of the substrate 1 is about 0.3 µm.

Figure 7:
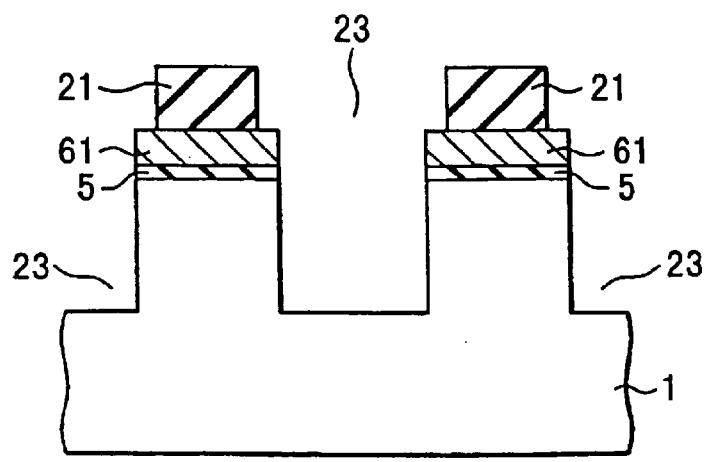
FIG. 7 is a cross-sectional view of the memory cell included in the NAND type EEPROM as shown in FIG. 4B, which is in a succeeding step of the step of FIG. 6 of the semiconductor device manufacturing method of the present invention.

Next, as shown in FIG. 7, the photoresist 22 is removed, and thereafter the silicon nitride film 21 is backed off by wet etching by about 20 nm to make the silicon nitride film 22 smaller in size than the pattern of the photoresist 22.

Figure 8:
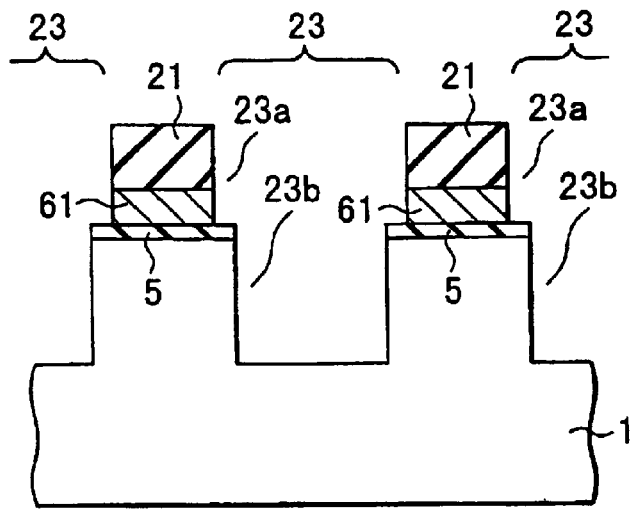
FIG. 8 is a cross-sectional view of the memory cell included in the NAND type EEPROM as shown in FIG. 4B, which is in a succeeding step of the step of FIG. 7 of the semiconductor device manufacturing method of the present invention.

As shown in FIG. 8, while using the size-reduced silicon nitride film 21 as a mask, the amorphous silicon 61 is anisotropically etched. Amorphous silicon material has excellent processing accuracy compared with that of, for example, polysilicon material and provides good size-accuracy of the etched side surface. The trench 23 has, therefore, an upper portion 23a (opening portion of the trench 23) wider than a lower portion 23b.

Figure 9:
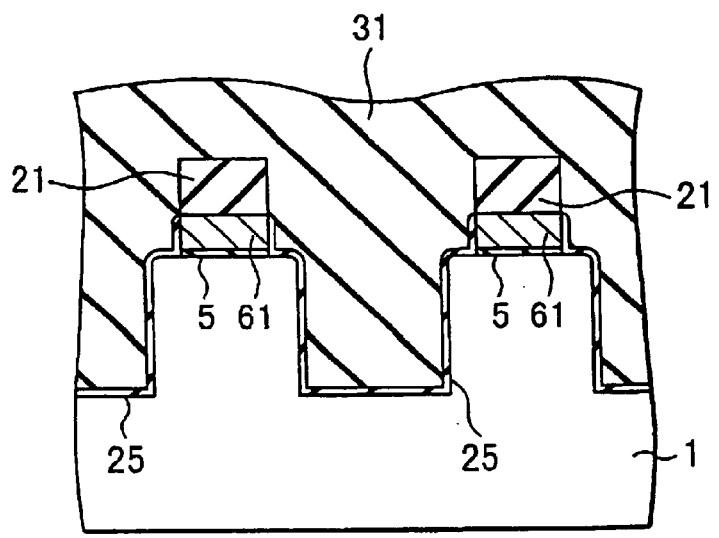
FIG. 9 is a cross-sectional view of the memory cell included in the NAND type EEPROM as shown in FIG. 4B, which is in a succeeding step of the step of FIG. 8 of the semiconductor device manufacturing method of the present invention.

Next, as shown in FIG. 9, for purposes of easing etching damage, the inner wall surface of the trench 23 is thermally oxidized (silicon oxide film 25). To fill in the interior of the trench 23, TEOS (tetraethoxysilane), for example, is used as a reaction gas to deposit silicon oxide on the substrate by the CVD method to form a silicon oxide film 31 on the substrate. Thereafter, a thermal step is conducted at 700 to 800° C. for about 30 minutes so as to improve the shape of the oxide film 31 embedded in the trench 23.

The upper portion of the trench 23, i.e., the trench opening portion, having an inner wall which is the amorphous silicon 61 is wider than the trench lower portion having an inner wall which is the semiconductor substrate 1. The shape of the oxide film 31 embedded in the trench 23 by the oxide film deposition can be improved compared with that in the conventional method.

Consequently, it is possible to decrease temperature and shorten time in a later thermal step for improving the shape of the oxide film 31 embedded in the trench 23 by the oxide film deposition. Conventionally, the thermal step is executed at a temperature of 900 to 1000° C. for about one hour. The present invention can decrease the temperature of the thermal step to 700 to 800° C. and reduce the time thereof to about 30 minutes.

Figure 10:
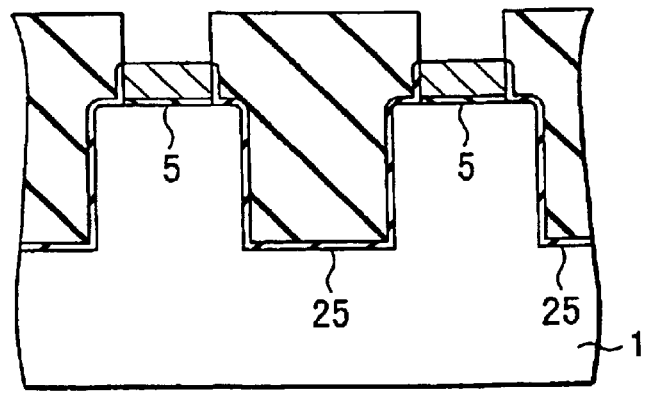
FIG. 10 is a cross-sectional view of the memory cell included in the NAND type EEPROM as shown in FIG. 4B, which is in a succeeding step of the step of FIG. 9 of the semiconductor device manufacturing method of the present invention.

Next, the oxide film 31 is flattened by using the CMP (chemical mechanical polishing) technique. The oxide film 31 is polished off until the surface of the silicon nitride film 21 is exposed. The silicon nitride film 21 serves as a stopper for the CMP process. The silicon nitride film 21 is then removed (FIG. 10).

Figure 11:
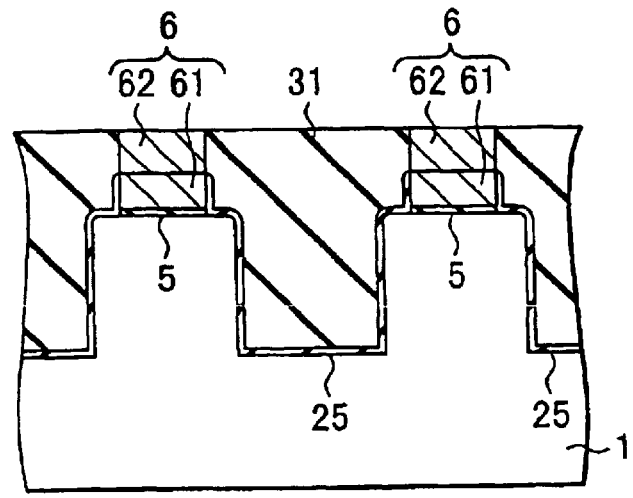
FIG. 11 is a cross-sectional view of the memory cell included in the NAND type EEPROM as shown in FIG. 4B, which is in a succeeding step of the step of FIG. 10 of the semiconductor device manufacturing method of the present invention.

Next, as shown in FIG. 11, a conductive polysilicon (second gate material) 62 is deposited to fill in the portion at which the silicon nitride film 21 has been removed. Impurities within the polysilicon 62 are diffused into the amorphous silicon 61 to decrease resistance. Although the amorphous silicon 61 may not be already amorphous, it is referred to as amorphous silicon 62 for convenience sake. Thereafter, CMP is conducted using the oxide film 31 as a stopper. Thus, the stacked layer of the amorphous silicon 61 and the polysilicon 62 becomes a floating gate 6.

Figure 12:
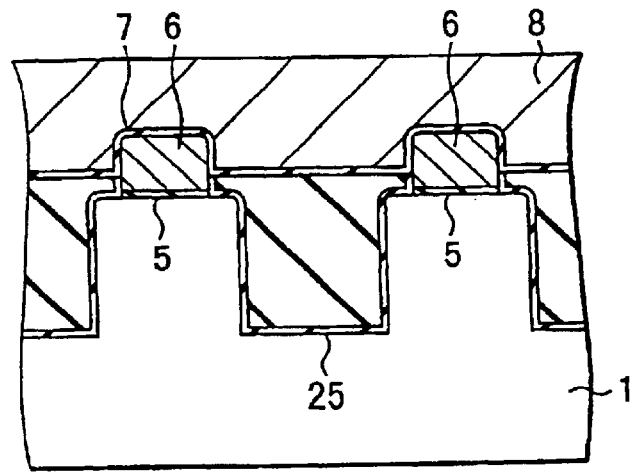
FIG. 12 is a cross-sectional view of the memory cell included in the NAND type EEPROM as shown in FIG. 4B, which is in a succeeding step of the step of FIG. 11 of the semiconductor device manufacturing method of the present invention.

As shown in FIG. 12, the oxide film 31 is etched back by a predetermined amount to thereby expose part of the side surface of the floating gate 6. An ONO film (three-layered film of oxide film/nitride film/oxide film) 7 is formed, as an interlayer film, on the floating gate electrode material 6 and the oxide film 31, and then a polysilicon layer 8 which becomes a control gate electrode is deposited. Thereafter, the polysilicon layer 8 is flattened.

Next, the polysilicon layer 8, the interlayer ONO film 7 and the floating gate material 6 are etched in a line form in an orthogonal direction to the trench 23 by means of photolithography and the RIE method. Ion implantation is then conducted to form a source/drain region 9 (see FIG. 4A). As a result, the arrangement of a memory cell array including the floating gate electrodes FG, i.e. the floating gate electrodes 6, the control gate electrodes CG, i.e. the control gate electrodes 8, is formed (see FIGS. 4A and 4B).

In the above-stated embodiment, the insulating material layer which defines the element region is etched to be backed off and the gate electrode material (trench upper portion) is processed according to the pattern of the size-reduced insulating material layer, whereby the trench opening portion can be widened. Thus, the shape of the insulator (silicon oxide film 31) embedded in the trench by the deposition can be improved.

Accordingly, the thermal step for improving the shape of the insulator (silicon oxide film 31) embedded in the trench by the deposition can be conducted at lower temperature than that of the conventional method. Besides, the time required for this step can be shortened considerably. As a result, the deterioration of the gate insulating film which causes the deterioration of memory cell characteristics can be reduced and control characteristics for controlling the profiles of diffused layer in, for example, the channel region can be enhanced.

Further, in this embodiment, after the element isolation region is formed, the second gate member (polysilicon 62) is stacked on the first gate member (amorphous silicon 61) to thereby form a floating gate electrode material 6. Then, the insulator (silicon oxide film 31) in the element isolation region is etched back by a predetermined amount to thereby expose part of the side surface of the floating gate electrode material 6. Owing to this, when the insulator is embedded in the trench 23, coupling capacity for coupling the floating gate electrode (FG) 6 to the control gate electrode (CG) 8 in a resultant memory cell can be increased without increasing the aspect ratio of the trench 23. In other words, it is possible to increase the coupling ratio of the stacked gate structure of the memory cell while improving the shape of the insulator (silicon oxide film 31) embedded in the trench by the deposition.

Figure 13:
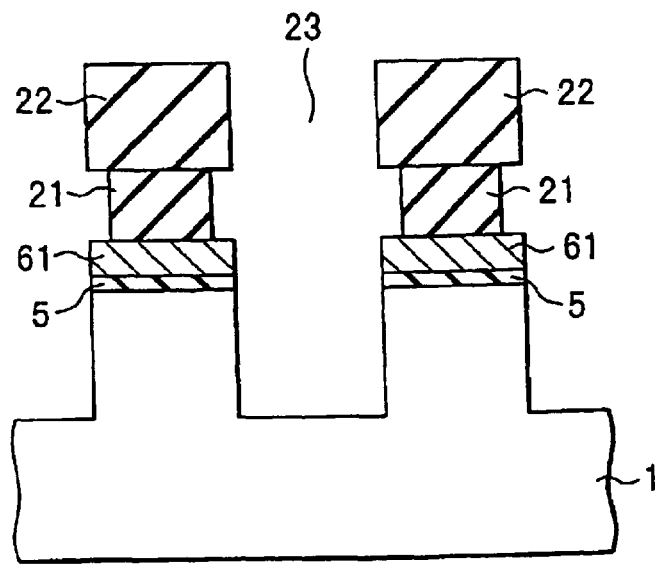
FIG. 13 is a cross-sectional view of the memory cell included in the NAND type EEPROM as shown in FIG. 4B, which is in a succeeding step of the step of FIG. 6 of another manufacturing method of the present invention.
Figure 14A:
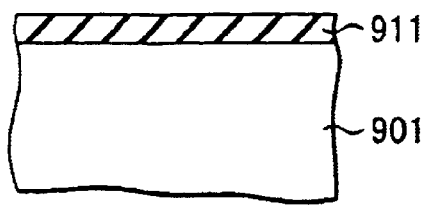
FIGS. 14A to 14E are cross-sectional views of a memory cell included in a NAND type EEPROM employing STI structure for element isolation, which are in respective steps of a conventional manufacturing method of a semiconductor device.
Figure 14B:
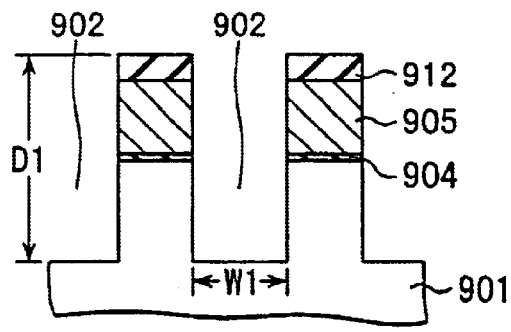
Figure 14C:
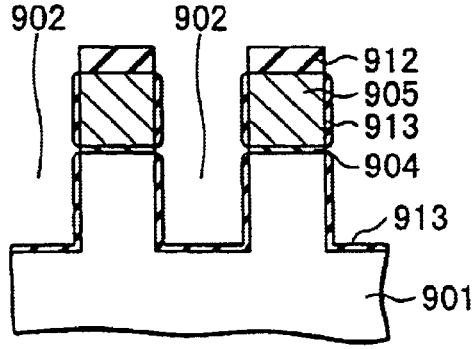
Figure 14D:
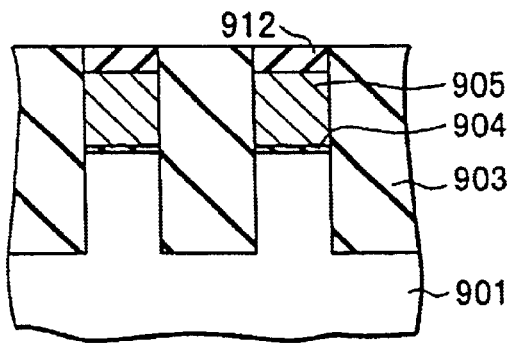
Figure 14E:
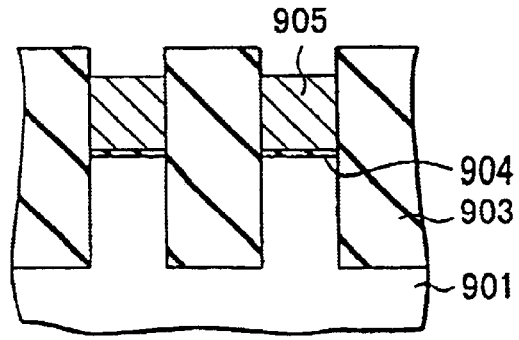

In the above embodiment, FIG. 7 illustrates the method in which the photoresist 22 is removed and then the silicon nitride film 21 is subjected to wet etching. It is also possible to utilize a method in which the silicon nitride film 21 is subjected to wet etching prior to the removal of the photoresist 22. The latter case is shown in FIG. 13.

As can be understood from the above description, according to the semiconductor device manufacturing method of the present invention, the trench lower portion (104*b*, 23*b*) in the depth direction of the trench has an inner wall which is the semiconductor substrate (101, 1) and the trench upper portion (104*a*, 23*a*) in the depth direction thereof has an inner wall which is the gate oxide film and the gate electrode (103, 6) in the STI structure.

According to the respective embodiments described above, an insulating material layer serving as a stopper at the time of flattening an insulator embedded in the trench by the CMP method is etched by a predetermined amount and etching is further conducted to widen the opening portion of the trench while using this insulating material layer as a mask. As a result, it is possible to greatly reduce the generation of clearances and seams in the insulator which has been embedded in the trench. Hence, by improving the shape of the insulator embedded in the trench by the deposition, the reliability of the semiconductor device can be enhanced.

As stated so far, according to the present invention, STI structure is adopted and the shape of the insulator embedded in the trench by the deposition is thereby improved. As a result, it is possible to provide a semiconductor device manufacturing method capable of relaxing a thermal step for improving the shape of the insulator embedded in the trench by the deposition and capable of enhancing the reliability of a resultant semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate having an element region;
   a first gate insulating film of a transistor, formed on the element region of the semiconductor substrate;
   a first gate electrode layer of the transistor, formed on a portion of a surface of the first gate insulating film, the first gate electrode layer being smaller in a width direction of a channel of the transistor than the element region so that the surface of the first gate insulating film has a peripheral portion in the width direction of the channel of the transistor, in which the first gate electrode layer is not formed; and
   an element isolation film embedded in a trench formed between adjacent element regions, a surface of the element isolation film being higher than the surface of the first gate insulation film so that the element isolation film has a portion overhanging on the peripheral portion of the surface of the first gate insulating film.

2. A semiconductor device according to claim 1 wherein the semiconductor device further comprises:
   a second gate insulating film formed on the first gate electrode layer; and
   a second gate electrode layer on the second gate insulating film; and wherein
   the first gate electrode layer is patterned in a self-aligned manner to the second gate electrode layer and the second gate insulating film.

3. A semiconductor device according to claim 1, wherein the first gate electrode layer is made of polysilicon.

4. A semiconductor device according to claim 1 wherein the second gate electrode layer is made of polysilicon.

5. A semiconductor device according to claim 1, wherein the insulator is made of silicon dioxide.

6. A semiconductor device according to claim 1, wherein the first gate insulating film is made of silicon dioxide.

7. A semiconductor device according to claim 1, wherein the second gate insulating film comprises a three-layered film of oxide film/nitride film/oxide film.

8. A semiconductor device according to claim 1, wherein the semiconductor device further comprises an impurity diffused region formed in that portion of the element region of the semiconductor substrate on which the first gate electrode layer is not provided.

9. A semiconductor device according to claim 8, wherein a conductivity of the impurity diffused region is the same as that of the semiconductor substrate.

10. A semiconductor device according to claim 1, wherein the semiconductor device further comprises a second gate electrode layer formed above the first gate electrode layer, with a second gate insulation film provided therebetween, in which the first gate electrode layer acts as a floating gate electrode and the second gate electrode layer acts as a control gate electrode.

11. A semiconductor device according to claim 1, wherein the semiconductor device further comprises a bit line layer via which data is written/erased.

12. A semiconductor device according to claim 1, wherein a plurality of the transistors form a NAND type memory cell.

13. A semiconductor device according to claim 1, wherein a plurality of the transistors form an AND type memory cell.

14. A semiconductor device according to claim 1, wherein a plurality of the transistors form a NOR type memory cell.

15. A semiconductor device according to claim 1, wherein a plurality of the transistors form a NOR type memory cell.

16. A semiconductor device comprising:
   a plurality of memory cell transistors arranged in series on a semiconductor substrate in such a manner that a source region of one of the transistors is common to a drain region of an adjacent one of the transistors; wherein
   first and second select gate transistors in which the first select gate transistor is connected to an end of the series of the memory cell transistors and the second select gate transistor is connected to another end of the series of the memory cell transistors, wherein
   a first gate insulating film of each of the memory cell transistors is formed on an element region of the semiconductor substrate;
   a first gate electrode layer of each of the memory cell transistors is formed a portion of a surface of on the first gate insulating film, the first gate electrode layer being smaller in a width direction of a channel of each of the memory cell transistors than the element region so that the surface of the first gate insulation film has a peripheral portion in the width direction of the channel of each of the memory cell transistors in which the first gate electrode layer is not formed; and
   an element isolation film embedded in a trench formed between adjacent element regions, the element isolation film having a portion overhanging on the peripheral portion of the surface of the first gate insulating film.

17. A semiconductor device according to claim 16, wherein the semiconductor device further comprises:
a second gate insulating film formed on the first gate electrode layer; and
a second gate electrode layer on the second gate insulating film; and wherein
the first gate electrode layer is patterned in a self-aligned manner to the second gate electrode layer and the second gate insulating film.

18. A semiconductor device according to claim 16, wherein the first gate electrode layer is made of polysilicon.

19. A semiconductor device according to claim 16, wherein the second gate electrode layer is made of polysilicon.

20. A semiconductor device according to claim 16, wherein the insulator is made of silicon dioxide.

21. A semiconductor device according to claim 16, wherein the first gate insulating film is made of silicon dioxide.

22. A semiconductor device according to claim 16, wherein the second gate insulating film comprises a three-layered film of oxide film/nitride film/oxide film.

23. A semiconductor device according to claim 16, wherein the semiconductor device further comprises an impurity diffused region formed in that portion of the element region of the semiconductor substrate on which the first gate electrode layer is not provided.

24. A semiconductor device according to claim 23, wherein a conductivity of the impurity diffused region is the same as that of the semiconductor substrate.

25. A semiconductor device according to claim 16, wherein the semiconductor device further comprises a second gate electrode layer formed above the first gate electrode layer, with a second gate insulation film provided therebetween, in which the first gate electrode layer acts as a floating gate electrode and the second gate electrode layer acts as a control gate electrode.

26. A semiconductor device according to claim 16, wherein the semiconductor device further comprises a bit line layer through which data is written/erased.

27. A semiconductor device according to claim 16, wherein the memory cell transistors and the first and second select gate transistors form a NAND type memory cell.

28. A semiconductor device according to claim 16, wherein the memory cell transistors and the first and second select gate transistors form an AND type memory cell.

29. A semiconductor device according to claim 16, wherein the memory cell transistors and the first and second select gate transistors form a DINOR type memory cell.

30. A semiconductor device comprising:
a semiconductor substrate having an element region;
a first gate insulating film of a transistor, formed on the element region of the semiconductor substrate;
a first gate electrode layer of the transistor, formed on a portion of a surface of the first gate insulating film, the first gate electrode layer being smaller in a width direction of a channel of the transistor than the element region so that the surface of the first gate insulating film has a peripheral portion in the width direction of the channel of the transistor in which the first gate electrode layer is not formed; and
an element isolation film embedded in a trench formed between adjacent element regions, the element isolation film having a portion overhanging on the peripheral portion of the surface of the first gate insulating film.

31. A semiconductor device according to claim 30, wherein the semiconductor device further comprises:
a second gate insulating film formed on the first gate electrode layer; and
a second gate electrode layer on the second gate insulating film; and wherein the first gate electrode layer is patterned in a self-aligned manner to the second gate electrode layer and the second gate insulating film.

32. A semiconductor device according to claim 30, wherein the first gate electrode layer is made of polysilicon.

33. A semiconductor device according to claim 30, wherein the electrode layer is made of polysilicon.

34. A semiconductor device according to claim 30, wherein the insulator in of silicon dioxide.

35. A semiconductor device according to claim 30, wherein the first gate insulating film is made of silicon dioxide.

36. A semiconductor device according to claim 30, wherein the second gate insulating film comprises a three-layered film of oxide film/nitride film/oxide film.

37. A semiconductor device according to claim 30, wherein the semiconductor device further comprises an impurity diffused region formed in that portion of the element region of the semiconductor substrate on which the first gate electrode layer is not provided.

38. A semiconductor device according to claim 37, wherein a conductivity of the impurity diffused region is the same as that of the semiconductor substrate.

39. A semiconductor device according to claim 30, wherein the semiconductor device further comprises a second gate electrode layer formed above the first gate electrode layer, with a second gate insulation film provided therebetween, in which the first gate electrode layer acts as a floating gate electrode and second gate electrode layer acts as a control gate electrode.

40. A semiconductor device according to claim 30, wherein the semiconductor device further comprises a bit line layer via which data is written/erased.

41. A semiconductor device according to claim 30, wherein a plurality of the transistors form a NAND type memory cell.

42. A semiconductor device according to claim 30, wherein a plurality of the transistors form an AND type memory cell.

43. A semiconductor device according to claim 30, wherein a plurality of the transistors form a DINOR memory cell.

44. A semiconductor device according to claim 30, wherein a plurality transistors form a NOR type memory cell.

* * * * *